United States Patent [19]

Chung

[11] Patent Number: 5,406,572
[45] Date of Patent: Apr. 11, 1995

[54] HIGH POWER, HIGH PULSE REPETITION FREQUENCY, COMPACT, PULSED LASER DIODE DRIVER

[76] Inventor: Hyung D. Chung, 1-601 Jam Won Family Apt., Jam Won Dong, Seocho ku, Seoul, Rep. of Korea

[21] Appl. No.: 215,288

[22] Filed: Mar. 21, 1994

[30] Foreign Application Priority Data

Feb. 4, 1994 [KR] Rep. of Korea ............... 94-2144

[51] Int. Cl.$^6$ .................................................. H01S 3/00
[52] U.S. Cl. .......................................... 372/38; 372/29
[58] Field of Search ............................. 372/82, 38, 29

[56] References Cited

U.S. PATENT DOCUMENTS 5,305,338  5/1994  Wakata et al. ................... 372/29
5,309,463  5/1994  Kasai ................................. 372/29

*Primary Examiner*—Leon Scott, Jr.
*Attorney, Agent, or Firm*—Nolte, Nolte & Hunter

[57] ABSTRACT

A high power, pulsed laser diode driver maintaining high efficiency, light weight and compactness by a provision of an energy storage capacitor of a non-uniform stripline structure with a low impedance. The semiconductor laser driver includes a control unit for controlling an input drive signal, electric power conditioning and pulse charging unit for receiving said drive signal controlled in said control unit and thereby generating an electrical energy, energy storage unit for receiving said electrical energy from said electric power conditioning and pulse charging unit and storing the received electrical energy, triggering light source and drive unit for generating a low power, optical laser light when the electrical energy has been stored in the energy storage unit, optically activated semiconductor switch unit for converting the capacitively charged electrical energy into a high current impulse, and a high power laser array for converting said high current impulse received from said optically activated semiconductor switch unit into a high power, optical pulse to be outputted. The energy storage unit includes an energy storage capacitor of a non-uniform stripline structure with a very low impedance.

2 Claims, 5 Drawing Sheets

HIGH POWER, HIGH PULSE REPETITION FREQUENCY, COMPACT, PULSED LASER DIODE DRIVER

BACKGROUND OF THE INVENTION

1. Field of the Invention

The present invention relates to a laser diode driver, and more particularly to a high power, high pulse repetition frequency, pulsed laser diode driver.

2. Description of the Prior Art

Generally, laser drivers are mainly classified into gas lasers, solid-state lasers and semiconductor lasers. Although generating a high output power, gas lasers and solid-state lasers are bulky, heavy and expensive. Furthermore, they exhibit a deterioration in efficiency. On the other hand, semiconductor lasers are compact, light, inexpensive and very efficient. By virtue of such advantages, the utilization of the semiconductor lasers have recently been on increasing trend.

The conventional high power pulsed laser driver has a very high circuit impedance. Due to the severe impedance mismatch between the driver circuit (high impedance) and the laser array (extremely low impedance), rather than the electrical energy is used to operate the laser array, most of it is lost in the form of heat. However, for the operation of the high power semiconductor laser, current beyond the threshold level should be supplied to the semiconductor laser. Therefore, the lost energy as heat has to be compensated by increasing the pulse biasing voltage.

Therefore, the conventional high power, pulsed driver is designed with much high power capability. This requires even higher power semiconductor switch.

In the conventional high power, pulsed driver, as the lost energy is increased, the required power capability of the semiconductor switch goes up steeply. As a result, the capabilities of the laser driver such as the rise and fall times, pulsewidth and pulse repetition frequency (PRF) of the output laser pulse deteriorates rapidly, while steeply increasing the size and weight of the driver.

A critical parameter in the semiconductor laser diode operation is the supplied current level. At low current levels, namely, below threshold current level, laser diodes generate some spontaneous emission without laser output (laser light). As the current level increases, diode lasers pass a threshold where the population in the laser diode medium becomes inverted and laser action begins.

Therefore, below threshold current, very little laser light is emitted and its emission efficiency is very low. Once the current level passes the threshold, the light output rises steeply.

High power laser diodes, called the laser diode stripes or laser arrays, are produced by fabricating a large number of laser diodes on a single substrate. The laser output power level is proportional to the numbers of the laser diodes in the laser array. Obvious advantages of this fabrication technique are low manufacturing cost, mass production, miniaturization, and high reliability. The disadvantage is an extremely low on-state device resistance (much less than 1 ohm).

Because the laser arrays are fabricated by connecting numerous numbers of forward biased p-n junction device, namely, laser diode, in parallel, the on-state resistance of the laser arrays goes down as the numbers of the laser diodes in the array increase. Typically, on-state resistance of the high power laser arrays is in the range of a few ohms to less than 0.01 ohm. Meanwhile, as the output power level of the laser arrays increases (number of the laser diodes in the array gets bigger), the threshold current level for these lasers rises steeply.

The modulation scheme for the pulsed high power laser operation is a direct modulation in which the laser light is modulated by controlling the current flow into the laser array. For the high power, high PRF, pulsed laser operation, very high current pulse at high PRF has to be generated by the laser driver and delivered to an extremely low impedance load (laser array).

The capabilities of conventional high power, pulsed laser drivers primary depend on the capabilities of the high power semiconductor switches (such as silicon controlled rectifier (SCR), power field effect transistor (power FET), IGBT (insulated gate bipolar transistor) and power bipolar transistor).

The conventional high power pulsed laser driver, utilizing a circuit topology in which the high voltage capacitor is pulse biased and then the electrical energy is discharged by turning on the power semiconductor switch, has a very high circuit impedance. Due to the severe impedance mismatch between the driver circuit (high impedance) and the laser array (extremely low impedance), rather than the electrical energy is used to operate the laser array, most of it is lost in the form of heat. The amounts of generated heat are so large that a fan has to be installed to remove this heat from the driver. Further, (since the operation of a laser array requires certain current level), the lost energy has to be compensated by increasing the biasing voltage.

As the power handling capability of the conventional laser driver goes up, other capabilities (such as the rise and fall times, pulsewidth and PRF of the output laser pulse) of the laser driver deteriorate rapidly, while steeply increasing the size and weight of the driver.

As a result, the conventional high power, pulsed drivers are heavy and very bulky, compared to the laser arrays, and their capabilities such as the rise time, fall time and PRF are severely limited.

Beside the peak laser output power capability, other important and critical parameters of the pulsed laser driver are modulation speed (high PRF), pulsewidth, efficiency, weight and compactness. There is no available pulsed laser driver producing high peak power light pulse with narrow pulsewidth at high PRF while maintaining high efficiency, light weight and compactness.

SUMMARY OF THE INVENTION

Therefore, an object of the invention is to provide a high power, pulsed laser diode driver maintaining high efficiency, light weight and compactness by a provision of an energy storage capacitor of a non-uniform stripline structure with a low impedance.

In accordance with the present invention, this object can be accomplished by providing a semiconductor laser driver comprising control means for controlling an input drive signal, electric power conditioning and pulse charging means for receiving said drive signal controlled in said control means and thereby generating an electrical energy, energy storage means for receiving said electrical energy from said electric power conditioning and pulse charging means and storing the received electrical energy, triggering light source and drive means for generating a low power, optical laser light when the electrical energy has been stored in the energy storage means, optically activated semiconductor switch means for converting the capacitively charged electrical energy into a high current impulse, and a high power laser array for converting said high current impulse received from said optically activated semiconductor switch means into a high power, optical pulse to be outputted, wherein said energy storage means comprises an energy storage capacitor with a very low impedance.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1:
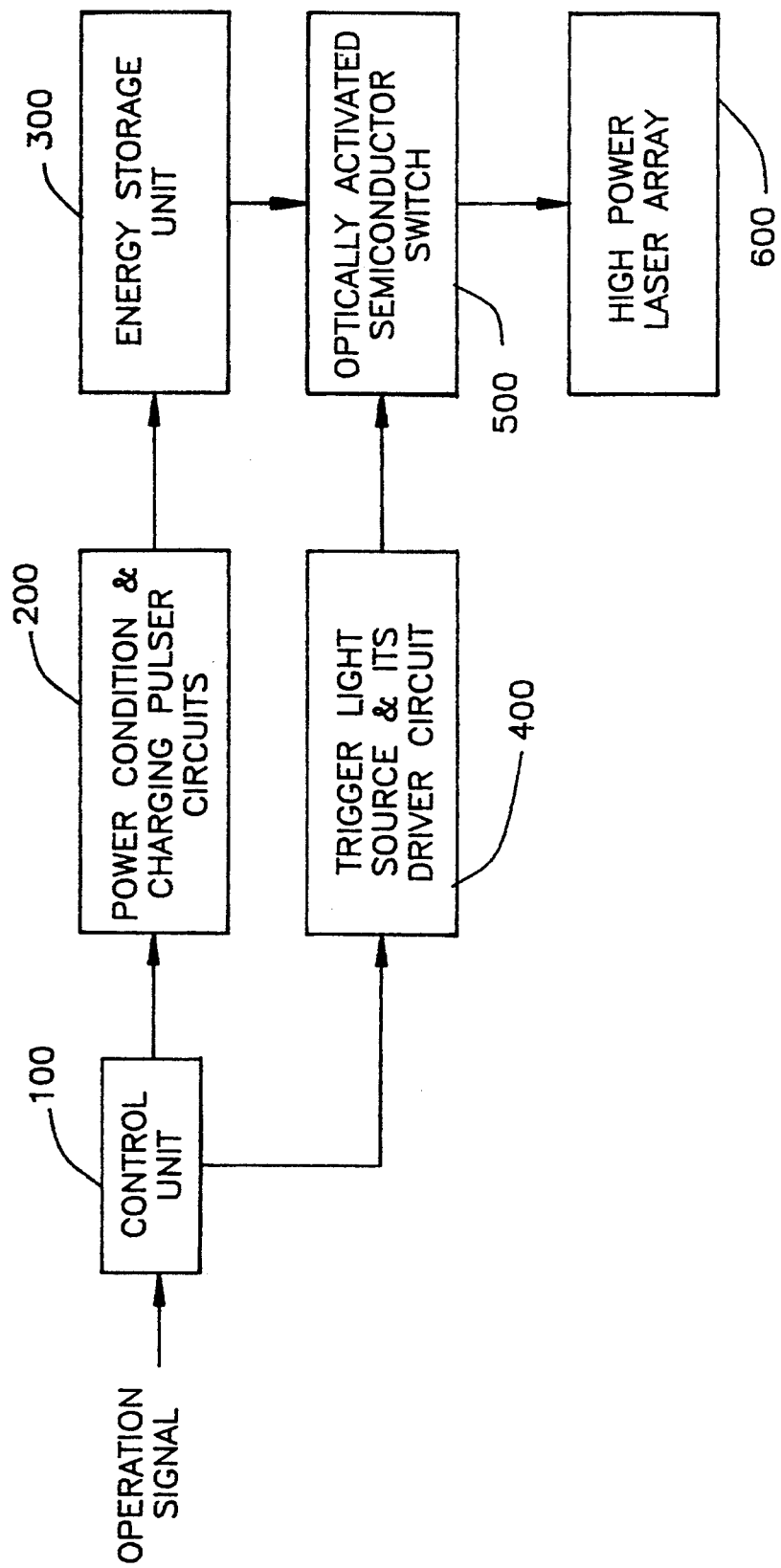
FIG. 1 is a block diagram of a laser diode driver in accordance with the present invention.
Figure 2A:
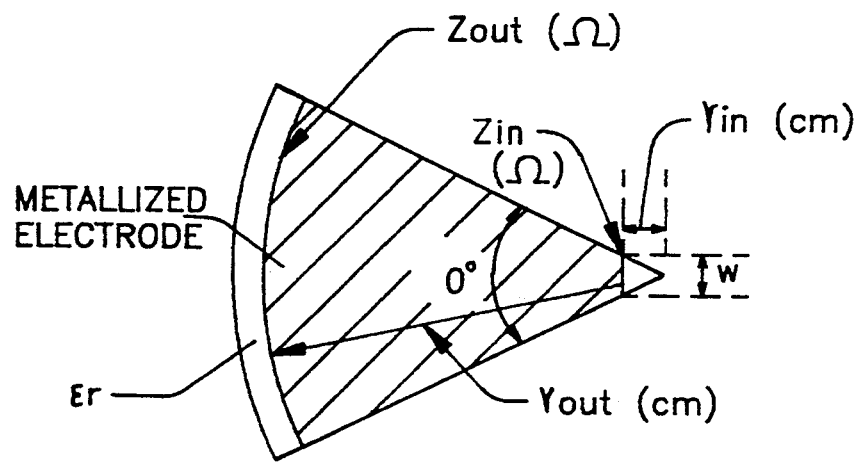
FIGS. 2a and 2b are a plan view and a sectional view illustrating an energy storage capacitor having a fan-shaped non-uniform stripline structure, respectively.
Figure 2B:
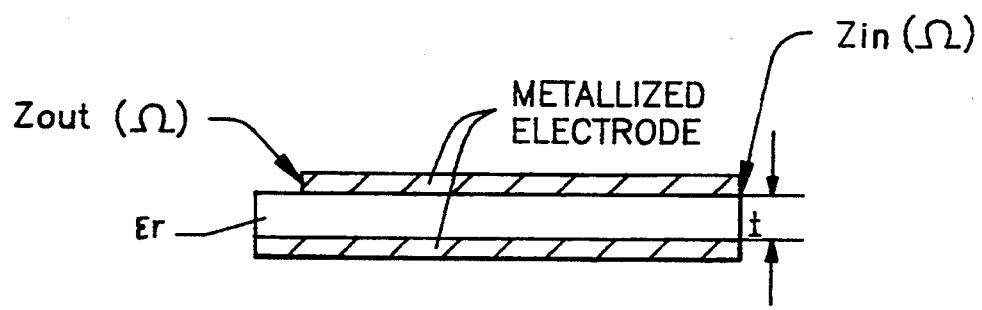
Figure 3A:
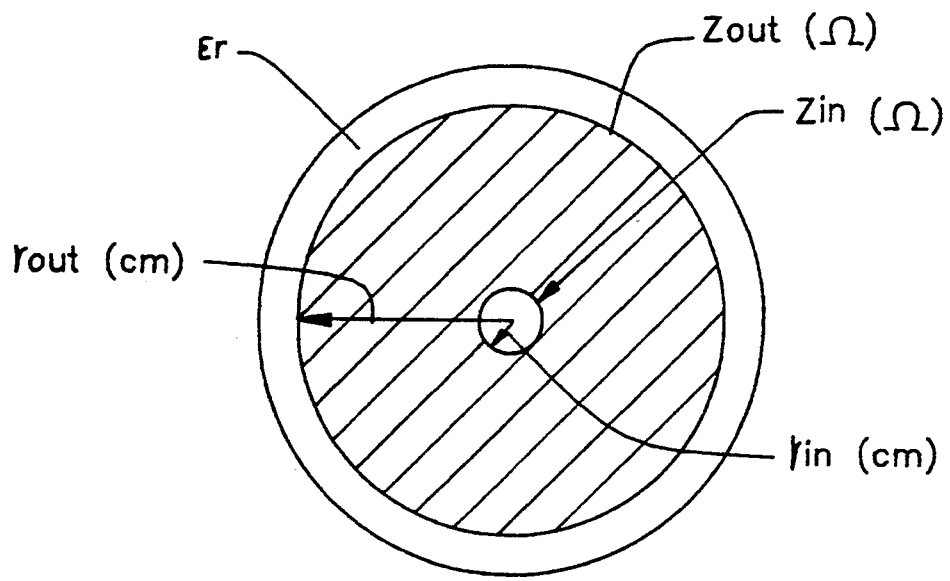
FIGS. 3a and 3b are a plan view and a sectional view illustrating an energy storage capacitor having a concentric strip-shaped non-uniform stripline structure, respectively.
Figure 3B:
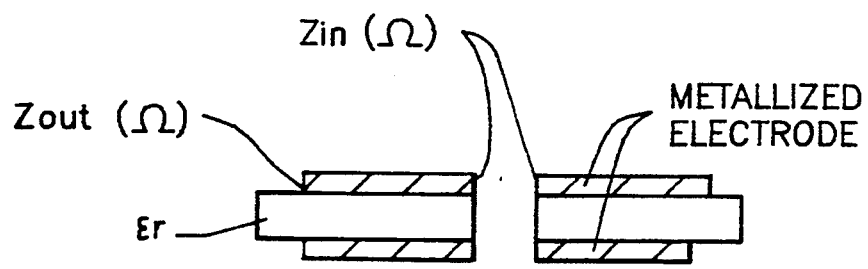

FIG. 1 is a block diagram of a high power, high PRF, compact, pulsed laser diode driver in accordance with the present invention is given in FIG. 1. The pulsed laser diode driver comprises a control unit 100, an electric power conditioning and pulse charging unit 200, an energy storage unit 300, a triggering light source and drive unit 400, an optically activated semiconductor switch unit 500, and a high power laser array 600.

The control unit 100 controls a signal introduced from an input stage and sends the controlled signal to the electric power conditioning and pulse charging unit 200. The control unit 100 applies a signal to the triggering light source and drive unit 400.

The electric power conditioning and pulse charging unit 200 conditions the prime electrical energy derived from either AC power line or battery by the signal from the control unit 100 and then sends certain energy to the energy storage unit 300. The electric power conditioning and pulse charging unit 200 also sends certain energy to the triggering light source and drive unit 400.

The energy storage unit 300 includes a low impedance capacitor having a non-uniform stripline structure and stores the energy received from the electric power conditioning and pulse charging unit 200.

The triggering light source and drive unit 400 includes a triggering light source serving to output optical laser light of low (or middle) power while being driven upon receiving the control signal from the control unit 100 when the energy storage in the energy storage unit 300 is completed.

The optically activated semiconductor switch unit 500 is kinds of optically activated switches such as thyristors, p-i-n switches, bulk GaAs switches, bulk Si switches, bulk InP switches, and etc. The switch unit 500 is turned on by the laser light received from the triggering light source and drive unit 400 to convert the capacitively charged electrostatic energy into the high current impulse.

As the optical light from the triggering optical source and drive unit 400 is introduced into the optically activated semiconductor switch unit 500, the capacitively charged electrostatic energy is converted into the form of high current impulse. Then the high power laser array 600 produces high power optical pulses.

The proposed high power, pulsed driver circuit uses innovative circuit elements and radically different operating principle. Rather than utilizing high voltage capacitor and high power semiconductor switch to modulate the laser arrays, the non-uniform stripline structure as the energy storage capacitor provides design flexibility, high circuit efficiency, light weight and compactness. In particular, with this stripline structure, designing an energy storage capacitor with very low circuit impedance becomes very easy. By using the laser diode triggered semiconductor switch, the critical limitations of the power semiconductor switches such as slow rise and fall times, low PRF and wide pulsewidth are easily overcame. Successful combination of the low impedance energy storage capacitor and the low (or medium) power laser diode triggered semiconductor switch results in a compact, pulsed laser diode driver capable of generating high peak power light pulses with a narrow pulsewidth at high PRF.

The energy storage unit 300 is made of non-uniform impedance stripline structures such as fan-shaped or concentric strip-shaped structures, as shown in FIGS. 2a and 2b, and 3a and 3b, respectively. The capacitance and characteristic impedance of the stripline are given as follows:

$$C = \epsilon_0 \epsilon_\gamma A / t, \text{ Farad(F)}$$

$$Z_0 = (377 \times t)/(\sqrt{\epsilon_\gamma} \times w), \text{ ohms}(\Omega)$$

where, C is the capacitance, A is the electrode area of the capacitor, $\epsilon_0$ is the permittivity of free space, t is the thickness of the dielectric medium, $\epsilon_\gamma$ is the dielectric constant of the dielectric medium, $Z_0$ is the characteristic impedance of the stripline and w is the width of the electrode of the stripline, respectively.

By exploiting the geometrical effects of the non-uniform stripline structure, an energy storage capacitor with a very low impedance is designed.

When the electrical energy is transferred from the low impedance capacitor to the high power laser array, most of it is used to operate the laser array. Accordingly, the low impedance capacitor greatly reduces the energy loss during the energy transfer from the capacitor to the laser array.

The main function of the energy storage unit 300 is temporarily holding the electrical energy in the form of the electrostatic energy. However, when the energy blocking switch is turned on, the boundary conditions of the energy storage capacitor at the contact area with the switch is changed from open to the close state. As soon as the boundary condition is changed, the electrostatic energy stored in the capacitor becomes traveling wave and starts to flow toward load through the switch.

Figure 4:
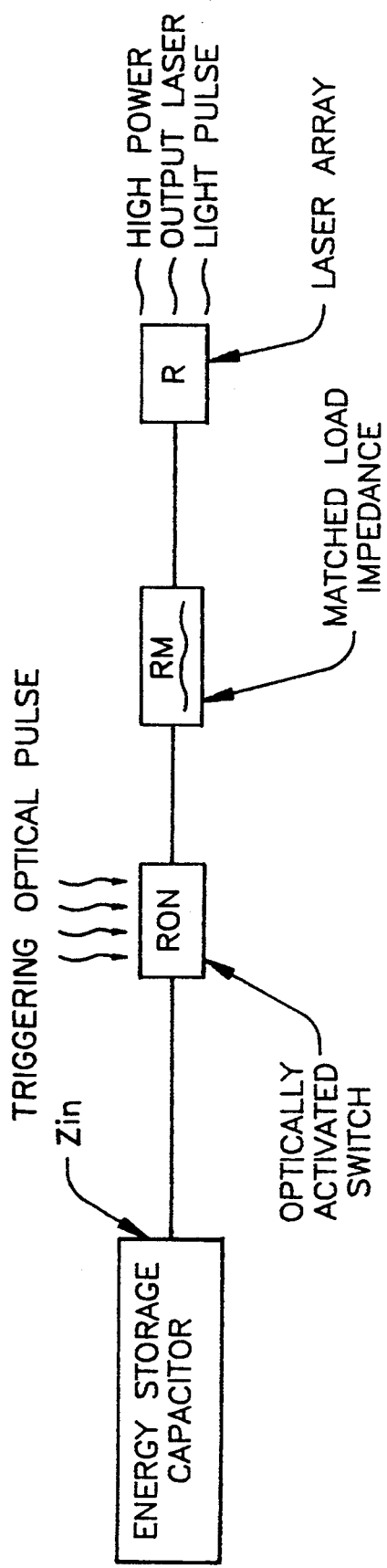
FIG. 4 is a block diagram illustrating a co-operation between the energy storage capacitor of the present invention and a laser array.

In particular, when the energy storage capacitor is connected into the matched load impedance, shown in FIG. 4, it acts like the transmission line. Rather than having the discharged waveforms with RC time constant decay curve, current pulses with sharp rise and fall times are produced. The pulsewidth of these pulses is about two-way wave transit time of the energy storage capacitor. And the amplitude of the current pulse is larger than the current amplitude obtained from the uniform impedance stripline due to the gaining factor associated with the impedance transformation. The generated current amplitude is given as follows:

$$I = \{(g/(R_{on}+R_m)\} \times V\{(R_{on}+R_m)/(Z_{in}+R_{on}+R_m)\}, Ampere(A)$$

where, g is the gaining factor due to the impedance transformation between the inner and outer characteristic impedances of the non-uniform stripline structure (the range of the coefficient value g is larger than 1 but less than 2), $R_m$ is the matched external impedance including the on-state impedance of the laser array), V is the pulse biased voltage, $Z_{in}$ is the inner characteristic impedance of the stripline, and $R_{on}$ is the on-state impedance of the semiconductor switch, respectively. In an 1deal matched impedance case, in which $R_{on}$ is negligible and $Z_{in}$ and $R_m$ is same, the generated current pulses becomes as follows:

$$I=(g/R_m) \times (V/2), Ampere(A)$$

This is almost like the well-defined matched uniform stripline except the gain factor g. The gain factor g provides additional circuit efficiency improvement. Therefore, utilization of the non-uniform, low impedance stripline structure as the energy storage capacitor results in an extremely high circuit efficiency.

The action of the driver starts by forwarding the operating instruction to the control unit 100 which initiates sequence of actions. At first the electrical power conditioning and pulse charging unit 200 is activated. The prime power from either AC power line or battery is conditioned by the activated electrical power conditioning and pulse charging unit 200 and used to pulse charging the capacitor of the energy storage unit 300. At the time the pulse biasing voltage of the capacitor reaches the peak voltage, the triggering light source and drive unit 400 is activated by the control signal from the control unit 100.

The triggering light source and drive unit 400 generates a fast rise time optical pulse at very high PRF and sends it to the optically activated semiconductor switch unit 500.

The generated optical pulse from the triggering light source and drive unit 400 is coupled into fiber optic pigtail, delivered through the fiber optic pigtail, and used to activate the semiconductor switch unit 500.

Thereafter, the triggering optical light passes through the active area of the semiconductor switch. Once triggering optical light is penetrated into the active area of the semiconductor switch, it produces sufficient numbers of the photon-generated electron-hole pairs so that the state of the switch changes from completely open (non-conducting) to completely closing (conducting).

When the switch is turned on, the electrostatic energy stored in the capacitor of the energy storage unit 300 is discharged in the form of the narrow current pulses. As the current pulses, well beyond the threshold level, are flowed onto the laser array 600, high power laser light pulses with Fast rise and fall times are generated.

Figure 5A:
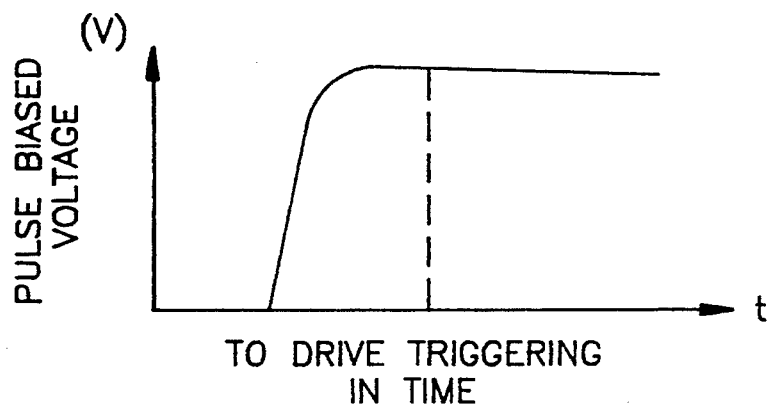
FIGS. 5a to 5c are graphs respectively illustrating sequences of the energy flow of this driver.
Figure 5B:
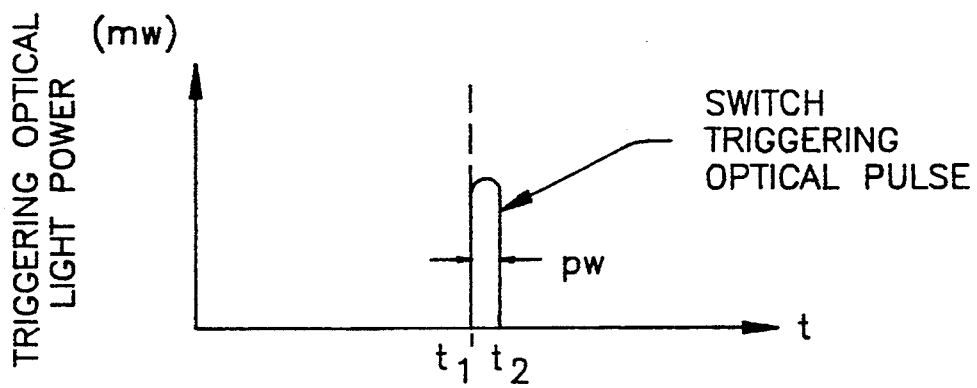
Figure 5C:
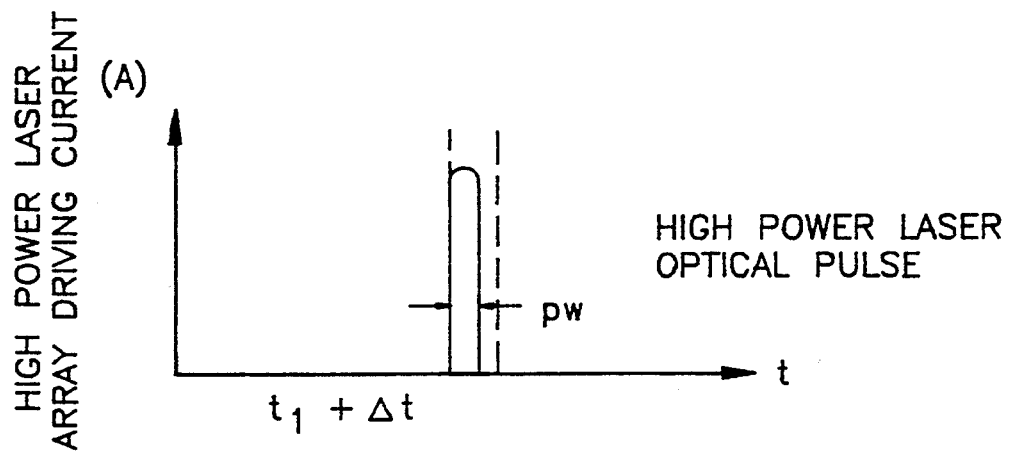

The graphical sequences of the energy flow of this driver are given in FIGS. 5a, 5b and 5c. When the semiconductor switch is triggered, the generated optical pulse shape is very similar to the driving current pulse shape except the rise time of the output laser pulse is faster than the rise time of the driving current pulse. However, the pulsewidth of the generated current pulses is determined by the pulsewidth of the triggering optical pulses as well as the wave transit time in the energy storage capacitor.

In a well matched impedance case, the pulse width of the output laser light will be about two-way wave transit time in the energy storage capacitor, as expressed by the following equation:

$$p\omega = 2 \times \sqrt{\epsilon_\gamma} \times (\Gamma_{out} - \Gamma_{in})/(3 \times 10^{10}) \text{ second}$$

In the case of the sever impedance mismatch case, the pulsewidth of the output laser light will be very much like the pulsewidth of the triggering optical pulse. This is mainly due to the multi-reflections of the traveling wave, caused by the severely mismatched impedance.

For the power semiconductor switch, as the power handling capability of the power semiconductor switch increases, both the rise time and the fall time of the switch slow down and its switch-on time becomes longer. As a consequence, PRF capability of the power semiconductor switch goes down rapidly as the power handling capability of these switches goes up slowly.

Rather than producing current pulse by the high power semiconductor switch, by generating fast rise time optical pulse from the low (or medium) power laser diode and using it as the triggering light, the semiconductor laser driver is able to generate high current pluses with fast rise time.

Accordingly, the geometrical effect of the non-uniform stripline structure enables the design of a compact energy storage capacitor with very low impedance. This low impedance capacitor greatly reduce the energy loss during the energy transfer from the capacitor to the laser array.

Unlike the conventional high power, pulsed laser driver, the resultant pulsed driver which is very efficient eliminates the need for the high-power power supply as well as the heat removing fan.

As apparent from the above description, the present invention provides a high power, pulsed laser driver including an energy storage capacitor of a non-uniform stripline structure with a low impedance. Hence, it is possible to greatly reduce the loss of electrical energy of the laser array while maintaining high efficiency, light weight and compactness.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor laser driver which controls an input drive signal to generate a low power laser optical light, and thereby generate a high current impulse, said driver comprising:

control means for controlling the input drive signal;
electric power conditioning and pulse charging means for receiving said drive signal controlled in said control means and thereby generating an electrical energy;
energy storage means:
    for receiving said electrical energy from said electric power conditioning and pulse charging means, and
    for storing the received electrical energy;
a triggering light source;
drive means for powering the triggering light source and for thereby generating the low power, optical laser light;
optically activated semiconductor switch means for activation by the low power optical laser light and for converting the electrical energy in the energy storage means into the high current impulse; and
a high power laser array for converting said high current impulse received from said optically activated semiconductor switch means into a high power, optical pulse to be outputted;
wherein said energy storage means comprises an energy storage capacitor with a very low impedance.

2. A semiconductor laser driver in accordance with claim 1, wherein said energy storage capacitor has a non-uniform impedance stripline structure.

* * * * *